United States Patent

Ficner et al.

Patent Number: 5,821,036
Date of Patent: Oct. 13, 1998

[54] METHOD OF DEVELOPING POSITIVE PHOTORESIST AND COMPOSITIONS THEREFOR

[75] Inventors: Stanley A. Ficner, Bethlehem, Pa.; John Magvas, Piscataway, N.J.; Christopher F. Lyons, Freemont, Calif.; Wayne M. Moreau, Wappinger; Marina V. Plat, Hyde Park, both of N.Y.

[73] Assignee: Clariant Finance (BVI) Limited, Virgin Islands (Br.)

[21] Appl. No.: 960,105

[22] Filed: Oct. 27, 1997

Related U.S. Application Data

[63] Continuation of Ser. No. 376,172, Jan. 20, 1995.
[51] Int. Cl.$^6$ ........................................................ G03F 7/30
[52] U.S. Cl. ............................ 430/326; 430/165; 430/331
[58] Field of Search ..................................... 430/326, 331, 430/165

[56] References Cited

U.S. PATENT DOCUMENTS

| | | | |
|---|---|---|---|
| 4,628,023 | 12/1986 | Gawston et al. | 430/331 |
| 4,710,449 | 12/1987 | Lewis et al. | 430/326 |
| 4,732,836 | 3/1988 | Potvin et al. | 430/192 |
| 4,784,937 | 11/1988 | Tanaka et al. | 430/331 |
| 4,863,827 | 9/1989 | Jain et al. | 430/145 |
| 5,039,595 | 8/1991 | Schwalm et al. | 430/326 |

*Primary Examiner*—John S. Chu
*Attorney, Agent, or Firm*—Andrew F. Sayko, Jr.

[57] ABSTRACT

A method and composition for developing positive photoresists is illustrated. The developer of the present invention includes an ammonium hydroxide aqueous base and a surfactant of the fluorinated alkyl alkoxylate class most preferably present in an amount of from 10 to 30 ppm. A particularly preferred surfactant includes sulfonyl and amine moieties.

10 Claims, No Drawings

METHOD OF DEVELOPING POSITIVE PHOTORESIST AND COMPOSITIONS THEREFOR

This application is a continuation of application No. 08/376,172, filed Sep. 16, 1997, now abandoned.

TECHNICAL FIELD

The present invention relates generally to a method of developing a positive photoresist substrate and more particularly to the use of aqueous base developer compositions containing surfactants for positive photoresists. Developer compositions used in accordance with the present invention include an alkyl alkoxylate surfactant to enhance image formation especially when used in connection with diazonaphthoquinone photosensitive compounds in suitable binder systems.

BACKGROUND OF THE INVENTION

Photoresists are well known to those of skill in the art. Generally speaking, they must be sensitive to light so that patterns can be formed in them and they must selectively resist subsequent etching or other processing so that the pattern can be transferred to the substrate. The dominant photoresist system employed in integrated circuit manufacturing today is the novalak/diazonaphthoquinone combination. Naphthoquinone of the class employed in positive photoresists are typically formed by way of the reaction of a naphthoquinone diazide sulfonyl chloride with a phenolic compound. Reaction products thus formed might include the naphthoquinone (1,2) diazide (5)-sulfuryl, naphthoquinone (1,2) diazide (4)-sulfuryl, naphthoquinone (2,1) diazide (5)-sulfuryl, or naphthoquinone (2,1) diazide 4-sulfuryl radicals. Of course, the sulfonate esters thus synthesized might include the residue of any suitable phenolic compound. These diazides are fairly nonpolar organic molecules that are soluble in organic solvents, but not very soluble in water.

Upon exposure to light, diazonaphthoquinone photoactive compounds form a polar, base-soluble carboxylic acid in accordance with the following:

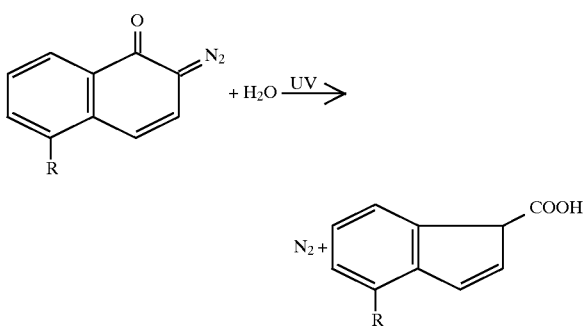

Thus, using an aqueous base as the developer, the exposed photoactive compound is relatively soluble, while the unexposed photoactive compound is relatively insoluble; creating a solubility difference which forms the basis of image formation.

It is not sufficient, however, to simply change the solubility of the photoactive compound, rather, the entire photoresist mixture must change its solubility. Thus, the interaction of the photoactive compound with the binder resin is likewise an important consideration, as is its absorption spectrum. Accordingly, positive photoresist compositions generally include a phenol-formaldehyde resin of the Novalak class or sometimes a hydroxystyrene polymer such as poly(4-hydroxystyrene). Other polymeric components, including styrene, methyl styrene, styrene-maleic anhydride components in combination with the foregoing may also be employed. See, generally, U.S. Pat. Nos. 4,732,836 and 4,863,827 to *Hoechst Celanese Corporation*, Somerville, N.J. for further information relating to positive photoresists.

Of considerable importance to the use of photoresists is the selection of a developer composition since development is a key aspect of the integrated circuit production process. Typically, optimizing the overall production is a trial and error procedure. This is true whether development is by immersion or by puddle or by spray techniques. U.S. Pat. No. 4,628,023 to Cawston et al discloses and claims an aqueous metal ion-free developer composition including metal-free alkali and surfactants. The developer described reportedly results in a reduction in the energy necessary to expose the resist without a deleterious effect on image quality and resolution. In U.S. Pat. No. 5,039,595 to Schwaim et al there is described another aqueous developer with a heterocyclic hydroxyalkyl compound as the hydroxy source. It is noted in the No. '539 patent that the following surfactants may be used: nonylphenoxypoly(ethyleneoxy) ethanol, octylphenoxypoly(ethyleneoxy)-ethanol or commercial fluorinated surfactants (col. 4, lines 45–51). Of course, commercial fluorinated surfactants could include a vast number of candidate surfactant compounds fo different types, for example ionic or non-ionic.

The use of surfactants, desirable in some respects, frequently makes the developing process difficult to control as is illustrated in U.S. Pat. No. 4,710,449 to J. M. Lewis and A. J. Blakeney. In the No. '449 patent it is illustrated that 1% (10,000 ppm) of a fluorinated alkyl alkoxylate in aqueous base developer is simply too aggressive, resulting in poor wall angles, contrast and unacceptable film loss. These problems may apparently be obviated by pre-treating the photoresist substrate with pre-dip of aqueous base developer solution containing a cationic surfactant. It is, however, undesirable from a materials and logistical perspective to increase the number of processing steps.

SUMMARY OF INVENTION

A method of developing a positive photoresist film subsequent to exposure is disclosed and claimed. The method of the present invention consists essentially of applying an aqueous base developer including an ammonium hydroxide base and a fluorinated alkyl alkoxylate surfactant present in an amount of from 1 to 250 ppm followed by rinsing away the developer composition. The basic and novel characteristics of the process are that low concentrations of surfactants are employed and that additional chemical pre-treatment steps of the exposed photoresist are unnecessary as has been reported with higher surfactant concentrations. Suitable surfactants may include the following:

1.  CF$_3$(CF$_2$)$_6$—CH$_2$CH$_2$O—(CH$_2$CH$_2$O)$_4$H

2.  CF$_3$(CF$_2$)$_5$—CO—N(CH$_3$)—(CH$_2$CH$_2$O)$_{12}$—CH$_3$

3. 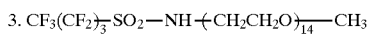 CF$_3$(CF$_2$)$_3$—SO$_2$—NH—(CH$_2$CH$_2$O)$_{14}$—CH$_3$

4. 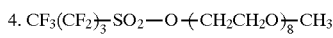 CF$_3$(CF$_2$)$_3$—SO$_2$—O—(CH$_2$CH$_2$O)$_8$—CH$_3$

5. 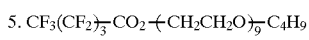 CF$_3$(CF$_2$)$_3$—CO$_2$—(CH$_2$CH$_2$O)$_9$—C$_4$H$_9$

6. 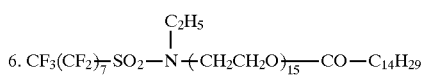 CF$_3$(CF$_2$)$_7$—SO$_2$—N(C$_2$H$_5$)—(CH$_2$CH$_2$O)$_{15}$—CO—C$_{14}$H$_{29}$ 7. 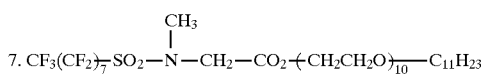 CF$_3$(CF$_2$)$_7$—SO$_2$—N(CH$_3$)—CH$_2$—CO$_2$—(CH$_2$CH$_2$O)$_{10}$—C$_{11}$H$_{23}$ which are hereafter referred to generally as fluorinated alkyl alkoxylates. A particularly preferred fluorinated alkoxylate is of the formula:

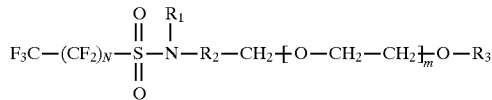

where R$_1$, R$_2$ and R$_3$ are the same or different and are C1–C10 alkyl groups and m and n are independently integers from 2 to 20.

In another aspect of the invention, preferred developer compositions are disclosed comprising aqueous ammonium hydroxide base and from 10–30 ppm fluorinated alkyl alkoxylate surfactant.

DETAILED DESCRIPTION

The present invention is described in detail below with reference to numerous examples provided for purposes of illustration and not by way of limitation. Modifications to specific embodiments will be readily apparent to those of skill in the art, which modifications are within the spirit and scope of the present invention as hereafter claimed. In general, from about 1 to about 250 parts per million by weight (ppm) of fluorinated alkyl alkoxylate surfactant are useful in connection with the instant developing process, from about 2 to 95 ppm is typical with from about 5 to about 50 ppm or even more specifically from about 10 to 30 ppm being preferred. The surfactant is dispersed in aqueous base which includes an ammonium hydroxide component. Generally the base is from about 0.15 to about 0.5 Normal in the hydroxide component, about 0.2 to about 0.35 Normal being more typical with about 0.261 Normal being preferred as an industry standard.

The ammonium hydroxide component may be tetramethylammonium hydroxide, trimethylethanol ammonium hydroxide (choline), tetra(2-hydroxyethyl) ammonium hydroxide, mixtures thereof, or like compounds. Tetramethylammonium hydroxide (TMAH) is particularly preferred, while other ammonium hydroxide compounds may be employed if so desired. While any positive photoresist substrate may be suitable, the inventive process is typically practiced upon compositions including a phenol-formaldehyde resin known as Novolak resins and a diazonaphthoquinone photoactive compound.

As used herein, the terminology "consists essentially of" refers to the fact that the developing process of the present invention does not require substantial steps other than applying the developer and rinsing it away after a suitable time interval. This is contrasted with the process disclosed by Lewis et al. where chemical pre-treatment with a cationic surfactant and base was found to be required prior to conventional development.

Typically, the fluorinated alkyl alkoxylate surfactants utilized in connection with the present invention include moieties

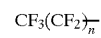

 and

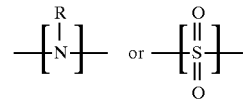

where m and n are the same or different and are integers from 2 to 20, R being a methyl, ethyl, propyl, or butyl alkyl substituent. Most preferably, the surfactant is of the formula:

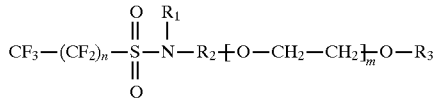

where R$_1$, R$_2$ and R$_3$ are the same or different and are C1–C10 alkyl groups and n and m are integers from 2 to 20.

Particularly preferred developer compositions include from about 10 to about 30 ppm fluorinated alkyl alkoxylate surfactant as should be apparent from the examples that follow.

EXAMPLES 1 THROUGH 12

This series of examples details the screening of aqueous base compositions particularly with respect to concentration of surfactant employed. In general, it is important in the production of integrated circuits that additives such as surfactants do not adversely affect process or product parameters such as depth of focus ("DOF") or achievable line width in the finished product, the light energy required to make the resist fully soluble under a given set of process conditions ("E clear" hereafter), the light energy required to print a 0.5 micron line in connection with a given process ("E nominal" hereafter) and whether a 0.35 micron line can be reliably produced ("clear 0.35" hereafter) in the following examples; which is a measure of ultimate performance. In the examples which follow, E clear or radiation dose to clear and E nominal are expressed in millijoules per square centimeter. DOF, that is, how much the distance from the radiation source may vary before a 0.5 micron wide-pattern will degrade is measured in microns. One of skill in the art will readily understand that DOF is a measure of the sensitivity to topography changes, while E nominal varies inversely with photospeed.

The solutions employed as developer in the following examples included a variety of surfactants added to aqueous base including ethylene glycol/propylene glycol 1:2 copolymer commonly referred generally to as oxirane which is available from a large number of sources. (Nonylphenoxy) polyethylene oxide hereafter referred to as "NPO"; (p-t-Octylphenoxy) polyethoxyethanol, hereafter referred to as "OPE", as well as butyl carbitol were also employed.

In each of Examples 1 through 12 a silicon wafer pretreated with hexamethyl disiloxane vapor was spin coated with a film of AZ™ 7500 positive photoresist available from Hoechst Celanese Corporation, Somerville, N.J. This photoresist is of the Novolak class, the resin being synthesized from M-cresol, 3,5 xylenol and formaldehyde. The photoactive component is made from naphthaquinone diazide sulfonyl chloride and tris(hydroxyphenyl)ethane.

The coated substrates were then soft baked at 110° C. for 60 seconds, the resulting resist films having a thickness of 1.29 microns or so. The coated wafers were exposed on a Nikon 0.54 numerical aperture (resolution recticle having a known pattern) I-line stepper while the substrate wafer is displaced in the X, Y and Z directions. The wafer was then post exposure baked at 110° C. for 60 seconds. Using a Silicon Valley Group (SVG) development track, the development protocol was to dispense developer onto the wafer through a fan spray for 3 seconds while the wafer coated as aforesaid was rotated at 300 revolutions per minute. Rotation of the substrate was stopped and developer was continued to be sprayed for two seconds followed by a hold for 47 seconds. The developed substrates were then rinsed with de-ionized water using a fan spray for 15 seconds while turning the wafer at 300 revolutions per minute followed by drying for 15 seconds at 400 revolutions per minute in the same apparatus.

This procedure was followed for examples 1–12 below, the materials and procedures being substantially identical except for the aqueous developer compositions which in all cases included 0.261N (2.38 weight per cent) TMAH electronic grade purity solution with varying amounts of surfactant (on a parts per million weight basis) as indicated in Table 1. For each example, $E_{clear}$ $E_{nominal}$ and DOF were determined. The particular method for adding the surfactant to the developer solution is not critical; it may simply be added to a container of suitable base followed by stirring, shaking or the like.

TABLE I

SURFACTANT PERFORMANCE vs. CONCENTRATION

| Example | Surfactant | Surfactant Concentration PPM | Eclear | Enominal | Clear 0.35 um | DOF, um |
|---|---|---|---|---|---|---|
| 1 |  | 0 | 97 | 180 | Yes | 1.2 |
| 2 | NPO | 400 ppm | 107 | 200 | No | 1.2 |
| 3 | NPO | 15 ppm |  | 180 | Yes | 1.2 |
| 4 | NPO | 75 ppm |  | 190 | Yes | 1.2 |
| 5 | NPO | 150 ppm |  | 180 | No | 1.2 |
| 6 | OPE | 250 ppm |  | 180 | Yes | 1.2 |
| 7 | OPE | 500 ppm | 98 | 170 | No | <1.2 |
| 8 | OPE | 1000 ppm | 102 | 165 | No | 1.2 |
| 9 | OPE | 1750 ppm | 94 | 160 | No | 1.2 |
| 10 | OPE | 2500 ppm |  | 140 | No | 1.0 |
| 11 | Oxirane | 400 ppm | 103 | 165 | No | 1.2 |
| 12 | Butyl Carbitol | 100 ppm |  | 180 | Yes | 1.2 |

As can be seen from the foregoing, processes wherein the step of developing the photoresist utilized an aqueous base with a concentration less than 250 parts per million surfactant are in most cases suitable, with less than 150 ppm surfactant being more preferred especially where the developing process consists essentially of applying the developing composition followed by rinsing and drying the substrate, that is, without significant pre-treatment steps prior to application of the developing solution such as the pre-treatment with base and surfactant as described by Lewis et al. in U.S. Pat. No. 4,710,449.

It has further been found that it is possible to utilize very small amounts of sulfonyl or amine containing fluorinated alkyl alkoxylate surfactants as is illustrated below.

Examples 13–16

Following generally the coating, exposure and developing procedures of Examples 1–12 a series of 4 wafers were prepared. For these wafers the stepper was operated in the x-y mode only without a patterned recticle or mask and the developer solution was in all cases 0.261N TMAH with the amount of surfactant indicated in Table 2. Thus, the wafers were provided with an unpatterned uniform resist film, the thickness of which was measured prior to exposure and development as well as subsequent thereto in five positions as shown in Table 2.

In addition to the control (no surfactant) and oxirane containing developing solutions of the previous examples, wafer No. 3 was developed with a surfactant termed Flourad™ FC 143 available from 3M Corporation, Minneapolis, Minn. which is ammonium pentadecafluorooctanoate ("AO") and the surfactant Fluorad™FC 171 (also available from 3M) was utilized in connection with wafer No. 4. FC 171 is sulfonyl and amino containing fluorinated alkyl alkoxylate surfactant of the general formula:

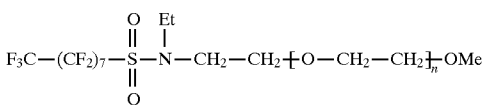

where n is an integer believed to be of from about 5 to about 15, probably about 10.

It can be seen from the above that FC-171 is more specifically a sulfonyl, amino and fluoroalkyl containing ethoxylate abbreviated SAE in Table II. For purposes of convenience, this compound may be named Poly(oxy-1,2-ethanediyl)-α-[2-[ethyl[(heptadecafluorooctyl) sulfonyl] amino] ethyl]-θ-methoxy for purposes of cataloging.

It should be noted from Table II that only the fluorinated alkyl alkoxylate gave superior results, that is uniformity superior to developer containing no surfactant. In all cases, from a qualitative perspective, surfactant containing developer exhibited superior wetting properties.

TABLE II

DEVELOPER COMPOSITIONS WITH LOW PPM SURFACTANT LEVELS

| Surfactant | Wafer # | | Pos 1 | Pos 2 | Pos 3 | Pos 4 | Pos 5 | Mean | Std Dev | Eclear |
|---|---|---|---|---|---|---|---|---|---|---|
| None | 1 | Before | 1.2831 | 1.2809 | 1.2792 | 1.2806 | 1.2799 | 1.28074 | 0.001318 | 103 |
| | | After | 0.7814 | 0.7697 | 0.7457 | 0.7546 | 0.7657 | 0.76342 | 0.012326 | |
| | | Difference | 0.5017 | 0.5112 | 0.5335 | 0.536 | 0.5142 | 0.51732 | 0.01121 | |
| 25 ppm Oxirane | 2 | Before | 1.2885 | 1.2873 | 1.2844 | 1.2866 | 1.2886 | 1.28638 | 0.001526 | 107 |
| | | After | 0.766 | 0.7877 | 0.767 | 0.7471 | 0.8022 | 0.774 | 0.019076 | |
| | | Difference | 0.519 | 0.4996 | 0.5174 | 0.5395 | 0.4864 | 0.51238 | 0.018126 | |
| 20 ppm AO | 3 | Before | 1.2885 | 1.288 | 1.2889 | 1.2908 | 1.2878 | 1.2888 | 0.001071 | 106 |
| | | After | 0.8803 | 0.9604 | 0.8844 | 0.8527 | 0.856 | 0.88676 | 0.038927 | |
| | | Difference | 0.4082 | 0.3276 | 0.4045 | 0.4381 | 0.4318 | 0.40204 | 0.039424 | |
| 20 ppm SAE | 4 | Before | 1.2906 | 1.2878 | 1.2905 | 1.2898 | 1.2844 | 1.28942 | 0.001129 | 104 |
| | | After | 0.883 | 0.8584 | 0.8646 | 0.8645 | 0.8715 | 0.8684 | 0.008395 | |
| | | Difference | 0.4076 | 0.4294 | 0.4259 | 0.4253 | 0.4169 | 0.42102 | 0.007867 | |

We claim:

1. A method of developing a substrate of positive photoresist film consisting of the steps of 1) coating a photoresist on a substrate to form a film, 2) imagewsie exposing said film, and 3) developing the positive photoresist using a process that consists of applying to said film an aqueous base developer composition including an aqueous ammonium hydroxide base and a fluorinated alkyl alkoxylate surfactant wherein said surfactant is present in an amount of from about 10 to about 30 ppm, and 4) followed by rinsing said developer composition from said film.

2. The method according to claim 1, wherein the concentration of said ammonium hydroxide base in said developer composition is from about 0.15 to about 0.5 Normal.

3. The method according to claim 1, wherein the concentration of said ammonium hydroxide base in said developer composition is from about 0.2 to about 3.5 Normal.

4. The method according to claim 1, wherein the concentration of said ammonium hydroxide base in said developer composition is about 0.261 Normal.

5. The method according to claim 1, wherein said ammonium hydroxide base is selected from the group consisting of tetramethylammonium hydroxide, trimethylethanolammonium hydroxide, tetra(2-hydroxyethyl) ammonium hydroxide and mixtures thereof.

6. The method according to claim 5, wherein said ammonium hydroxide base is tetramethylammonium hydroxide.

7. The method according to claim 1, wherein said positive photoresist film includes a phenol-formaldehyde resin and a diazonaphthoquinone photoactive compound.

8. The method according to claim 1, wherein said fluorinated alkyl alkoxylate includes the moieties I, II and III wherein I is

II is

and III is

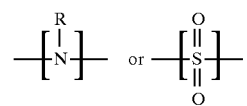

and wherein n and m are the same or different and are integers from 2 to 20, and R is hydrogen or a methyl, ethyl or propyl, or butyl alkyl group.

9. The method according to claim 1, wherein said fluorinated alkyl alkoxylate is of the structural formula:

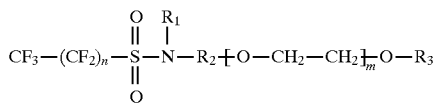

where $R_1$, $R_2$ and $R_3$ are the same or different and are C1–C10 alkyl groups and n and m are integers from 2 to 20.

10. The method according to claim 9, wherein said fluorinated alkyl alkoxylate is of the formula:

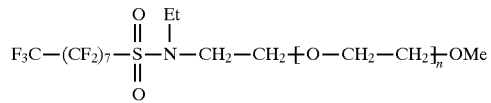

wherein n is an integer from about 5 to about 15, preferably about 10.

* * * * *